United States Patent
Zhang et al.

(10) Patent No.: US 9,922,751 B2
(45) Date of Patent: Mar. 20, 2018

(54) HELICALLY INSULATED TWINAX CABLE SYSTEMS AND METHODS

(71) Applicant: Intel Corporation, Santa Clara, CA (US)

(72) Inventors: Zhichao Zhang, Chandler, AZ (US); Gong Ouyang, Olympia, WA (US); Kai Xiao, University Place, WA (US); Eric J. Li, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/088,924

(22) Filed: Apr. 1, 2016

(65) Prior Publication Data
US 2017/0287591 A1    Oct. 5, 2017

(51) Int. Cl.
| | | |
|---|---|---|
| H01B 7/00 | (2006.01) | |
| H01B 7/02 | (2006.01) | |
| H05K 9/00 | (2006.01) | |
| H01B 13/08 | (2006.01) | |
| H01B 13/22 | (2006.01) | |

(52) U.S. Cl.
CPC ........... *H01B 7/0241* (2013.01); *H01B 13/08* (2013.01); *H01B 13/22* (2013.01); *H05K 9/0098* (2013.01)

(58) Field of Classification Search
CPC ... H01B 3/30; H01B 5/00; H01B 5/08; H01B 7/00; H01B 7/02; H01B 7/0241; H01B 7/08; H01B 9/025; H01B 11/1041

USPC ... 174/27, 110 R, 113 R, 117 R, 113 C, 115, 174/116
See application file for complete search history.

(56) References Cited

U.S. PATENT DOCUMENTS

| | | | | | |
|---|---|---|---|---|---|
| 411,137 | A | * | 9/1889 | Campbell | H01B 11/12 174/113 R |
| 452,340 | A | * | 5/1891 | Conner | H01B 7/285 156/51 |
| 2,348,752 | A | * | 5/1944 | Quayle | H01B 11/1847 174/27 |
| 2,430,378 | A | * | 11/1947 | Waldron | H01B 9/00 174/41 |
| 2,614,172 | A | * | 10/1952 | Greenfield | H01P 3/04 174/29 |
| 2,958,724 | A | * | 11/1960 | Milloit | H04B 3/28 174/33 |
| 3,475,893 | A | * | 11/1969 | Hiroyuki | H01B 13/0242 174/34 |
| 3,921,381 | A | * | 11/1975 | Vogelsberg | H01B 13/0271 174/32 |
| 4,393,582 | A | * | 7/1983 | Arnold, Jr. | H01B 13/2673 174/36 |
| 5,262,593 | A | * | 11/1993 | Madry | H01B 11/1856 174/102 P |
| 5,286,923 | A | * | 2/1994 | Prudhon | H01B 7/0233 174/107 |

(Continued)

*Primary Examiner* — William H Mayo, III
(74) *Attorney, Agent, or Firm* — Schwegman Lundberg & Woessner, P.A.

(57) ABSTRACT

A helically wound insulated twinax cable reduces cable dielectric loss by increasing the percentage of air in the dielectric filler surrounding the signal conductors. The helical insulator wire winding further provides mechanical support and reduces the risk of creating an electrical short-circuit. This will improve differential signaling capability of the two-conductor cable and enable longer cable range.

10 Claims, 16 Drawing Sheets

(56) References Cited

U.S. PATENT DOCUMENTS

| | | | | |
|---|---|---|---|---|
| 5,298,680 A * | 3/1994 | Kenny | ............... | H01B 11/04 174/34 |
| 5,880,402 A * | 3/1999 | Nugent | ............... | H01B 11/12 174/27 |
| 6,242,689 B1 * | 6/2001 | Budge | ............... | H01B 11/12 174/27 |
| 6,388,188 B1 * | 5/2002 | Harrison | ............... | H01B 11/002 174/113 C |
| 6,452,107 B1 * | 9/2002 | Kebabjian | ............... | H01B 11/002 174/113 R |
| 6,849,799 B2 * | 2/2005 | Springer | ............... | H01B 11/1847 174/113 C |
| 7,795,536 B2 * | 9/2010 | Plourde | ............... | H01B 11/1847 174/102 R |
| 8,907,211 B2 * | 12/2014 | Fox | ............... | H01B 9/028 174/110 R |
| 8,916,773 B2 * | 12/2014 | Mok | ............... | H01B 5/10 174/110 R |
| 9,293,239 B2 * | 3/2016 | Gareis | ............... | H01B 7/30 |
| 2005/0006132 A1 * | 1/2005 | Clark | ............... | H01B 7/184 174/113 C |
| 2006/0081388 A1 * | 4/2006 | Spath | ............... | H01B 9/006 174/27 |
| 2010/0126620 A1 * | 5/2010 | Johnson | ............... | H01B 11/04 140/118 |
| 2011/0247856 A1 * | 10/2011 | Matsuda | ............... | H01B 11/203 174/108 |
| 2011/0259626 A1 * | 10/2011 | Speer | ............... | H01B 11/10 174/113 C |

* cited by examiner

US 9,922,751 B2

HELICALLY INSULATED TWINAX CABLE SYSTEMS AND METHODS

TECHNICAL FIELD

Embodiments described herein generally relate to design and manufacturing of high speed signaling cables.

BACKGROUND

Twinax cables provide efficient transmission of signals. Twinax cables include two conductors surrounded by a dielectric insulating layer, where the insulating layer is in turn surrounded by a conducting shield. The attenuation (e.g., loss) associated with the cable depends on several features of the cable, such as cable length, conductor properties, and dielectric properties. The electrical properties of dielectric insulating layer include dielectric constant (e.g., relative permittivity value) and a loss tangent, where a reduced loss tangent represents an increased insulation efficiency.

The dielectric insulating layer may be manufactured using a low-loss dielectric extrusion technology called foam dielectric. During the foam dielectric extrusion process, the dielectric is extruded in a manner that generates air pockets (e.g., voids). Because air has low associated loss tangent, the air pockets reduce cable loss by increasing the percentage of air in the dielectric and reducing its effective loss tangent. However, this type of extrusion process is very complex, and may result in non-uniform numbers and sizes of air pockets. Further, the dielectric material and the manufacturing process is often proprietary to specific cable manufacturers and material vendors.

When the cable loss is high, an active cable may be used to compensate for the additional loss in order to meet a target cable range. However, active cables require externally supplied power and additional components, such as amplifiers, signal filters, or re-timers to be integrated into the cable. Due to these added costs, complexity, and external power requirements, active cables are often seldom used to extend the cable range.

It is desirable to improve passive twinax cable technologies while reducing the complexity of passive twinax cable fabrication.

These and other examples and features of the present cables, cable systems, and related methods will be set forth in part in the following detailed description. This overview is intended to provide non-limiting examples of the present subject matter, and it is not intended to provide an exclusive or exhaustive explanation. The detailed description below is included to provide further information about the present cables, cable systems, and methods.

DESCRIPTION OF EMBODIMENTS

Figure 1:
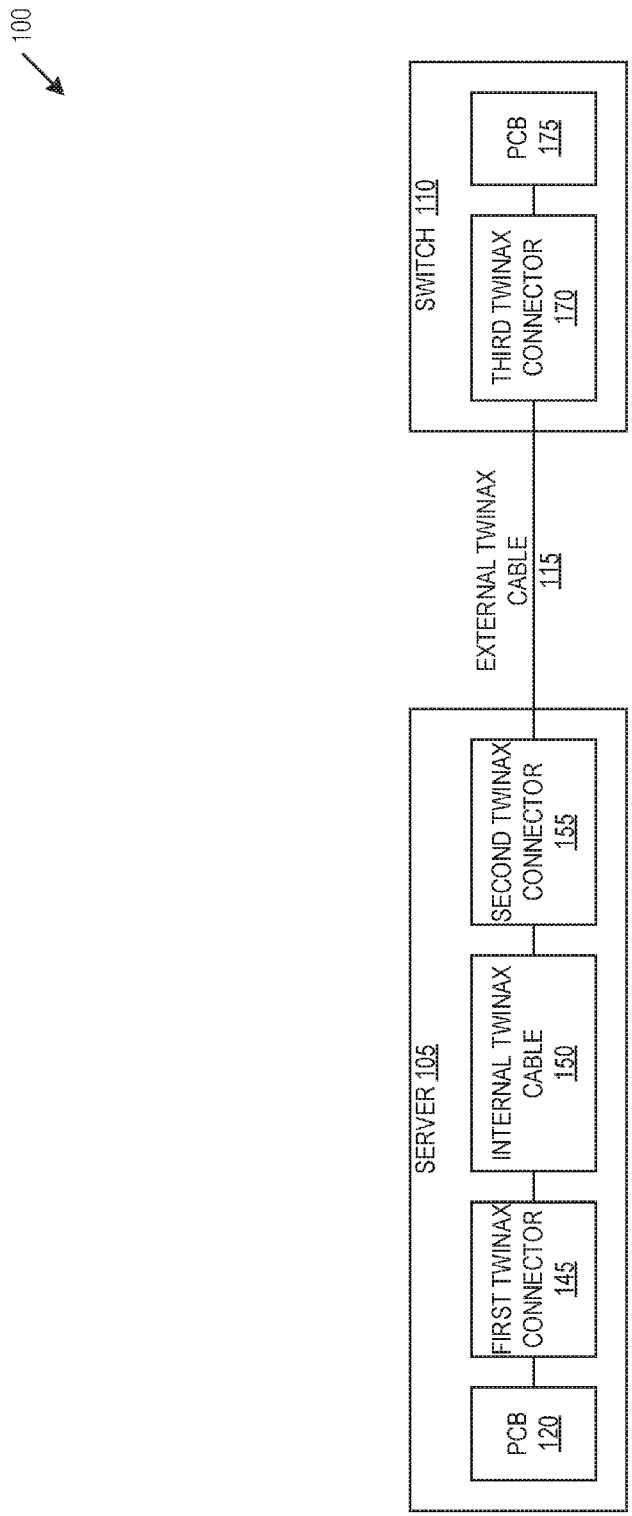
FIG. 1 is a block diagram of a fabric platform architecture, in accordance with at least one embodiment of the invention.

A helically insulated twinax cable provides improved performance by reducing the cable loss while reducing manufacturing cost and complexity. The electrical isolation between conductors is realized through winding of an insulator wire and not through the use of a solid dielectric surrounding. By avoiding a solid dielectric surrounding, the solid dielectric extrusion process is avoided. The high air percentage is achieved by replacing the solid insulators surrounding the conductors with the insulator wire wound helically around the conductors. The insulator wire may include an elongated and flexible insulating member. The insulator wire cross section may include a circular cross section, a rectangular cross section, or a cross section of another geometry. The insulator wire may have a consistent or variable thickness, and may have a consistent or variable width.

The helical winding reduces the dielectric loss by increasing the percentage of air in the dielectric filler surrounding the signal conductors. In an example, the percentage of air is greater than 50%. Because air is almost lossless, the total dielectric loss caused by the mixed medium (e.g., dielectric and air) surrounding the conductor is reduced. The air percentage may be altered by varying characteristics of the insulator wire, such as by varying cross section geometry, by varying insulator wire thickness, or by varying the spacing (e.g., pitch) between successive helical windings. The reduction in dielectric loss improves the quality and speed of signal transmission, especially for high-speed applications such as those above 5 Gbps.

The insulator wire may be wound using the braiding process described herein. The helical insulator wire winding further provides mechanical support and isolation between conductors. The simplicity of this braiding process reduces requirements for supplying and extruding foam dielectrics and other specialized materials and related equipment.

This helically insulated twinax cable results in a significant reduction in manufacturing cost while improving electrical performance due to its lower loss. This will improve differential signaling capability of the twinax cable, improve the overall channel margin performance, relieve the electrical loss budgets for other channel components, and enable longer cable range. The helical twinax cable can improve signal integrity of various communication technologies and protocols, including 100 G Ethernet, Quad Small Form-factor Pluggable (QSFP) transceivers, InfiniBand, Intel Omni-Path, Intel QuickPath Interconnect (QPI), Intel Ultra-Path Interconnect (UPI), or other technologies and protocols. The helically insulated twinax cable can improve performance of RF equipment operating at relatively higher RF frequencies, such as above 3 GHz. The helically insulated twinax cable can improve performance of electrical, optical, or wireless systems designed to operate at a high total digital transfer rate, such as exceeding 50 Gigabits per second (Gbps).

FIG. 1 is a block diagram of a platform architecture 100, in accordance with at least one embodiment of the invention. In an example, platform architecture 100 includes various components, such as a server 105, a network switch 110, and an external twinax cable 115 between the server 105 and the switch 110. In various embodiments, server 105 and switch 110 may represent any electronic devices connected to each other via external twinax cable 115. In this embodiment, server 105 includes a printed circuit board (PCB) 120 connected to a first twinax connector 145. An internal twinax cable 150 connects the first twinax connector 145 with a second twinax cable connector 155. The internal twinax cable 150 provides a connection between the server 105 and the external twinax cable 115.

The external twinax cable 115 connects the second twinax connector 155 to a third twinax connector 170 within the switch 110. The second twinax connector 155 may convey or convert a signal from the server 105. For example, the second twinax connector 155 may include a transceiver that interfaces between the server 105 and switch 110, such as using a quad small form-factor pluggable (QSFP) transceiver. External twinax cable 115 may convey a signal between the second twinax connector 155 and a third twinax connector 170, such as using a QSFP cable. The network switch 110 may transfer the received signal from the third twinax connector 170 through PCB 175, where the signal may be further processed or conveyed.

Within architecture 100, the cable signal loss (e.g., attenuation) between components has a significant effect on the overall data speed and signaling performance of the resultant architecture 100. In one example, architecture 100 may have a desired data transmission speed associated with a communicated signal, where the desired data transmission speed may be expressed as a function of cable transmission properties, such as expressing the total acceptable cable attenuation as a loss budget in decibels (dBs). The cable loss is affected significantly by the cable length and by data transmission characteristics of the cable. The use of the helically insulated low-loss twinax cable provides increased data transmission speeds, increased cable length, or both. For example, given a target value for the loss budget, the use of the low-loss twinax cable may increase the usable length of a cable by several meters. The increase in usable cable length is particularly useful in configurations where box-to-box cable length and loss budget present significant limitations, such as in architecture 100.

In addition to increasing box-to-box cable reach, the reduction in signal losses from helically insulated low-loss cable increases the amount of available signal loss within a given loss budget. This increase in available signal loss enables selection of higher-loss communication components or simplified design configurations, which may be used to reduce manufacturing cost and complexity. A loss budget may also include various attenuation margins, where the margins represent expected losses caused by randomly varying channel-specific or frequency-specific losses, such as PCB transmission line loss, connector loss, or cable loss. By reducing the loss contributed by insulating material surrounding the cable conductors of the twinax conductors, the helically insulated cable reduces the respective attenuation margins, further increasing the amount of available signal loss within a loss budget.

Figure 2:
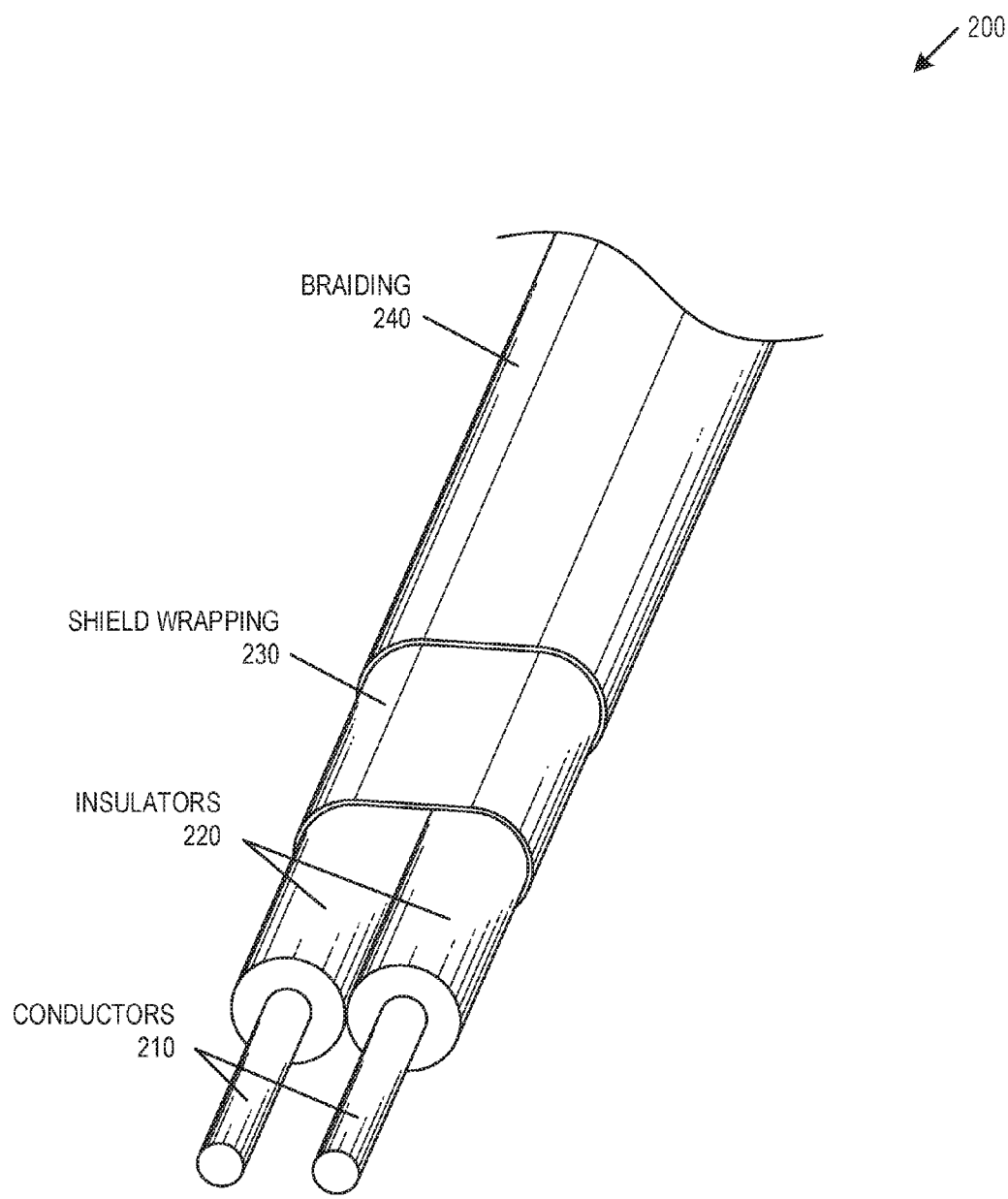
FIG. 2 is a perspective diagram of a coaxially insulated twinax cable, in accordance with at least one embodiment of the invention.

FIG. 2 is a perspective diagram of a coaxially insulated twinax cable 200, in accordance with at least one embodiment of the invention. Twinax cable 200 includes a pair of conductors 210, where each conductor is surrounded by insulators 220. Various techniques may be used to apply the insulators 220 to the conductors 210. For example, the extrusion process described above may be used to apply the insulators 220 to the conductors 210, however this process is complex and expensive. A shield wrapping 230 is applied to the insulators 220. A conductive braiding 240 is applied to the shield wrapping 230.

Figure 3:
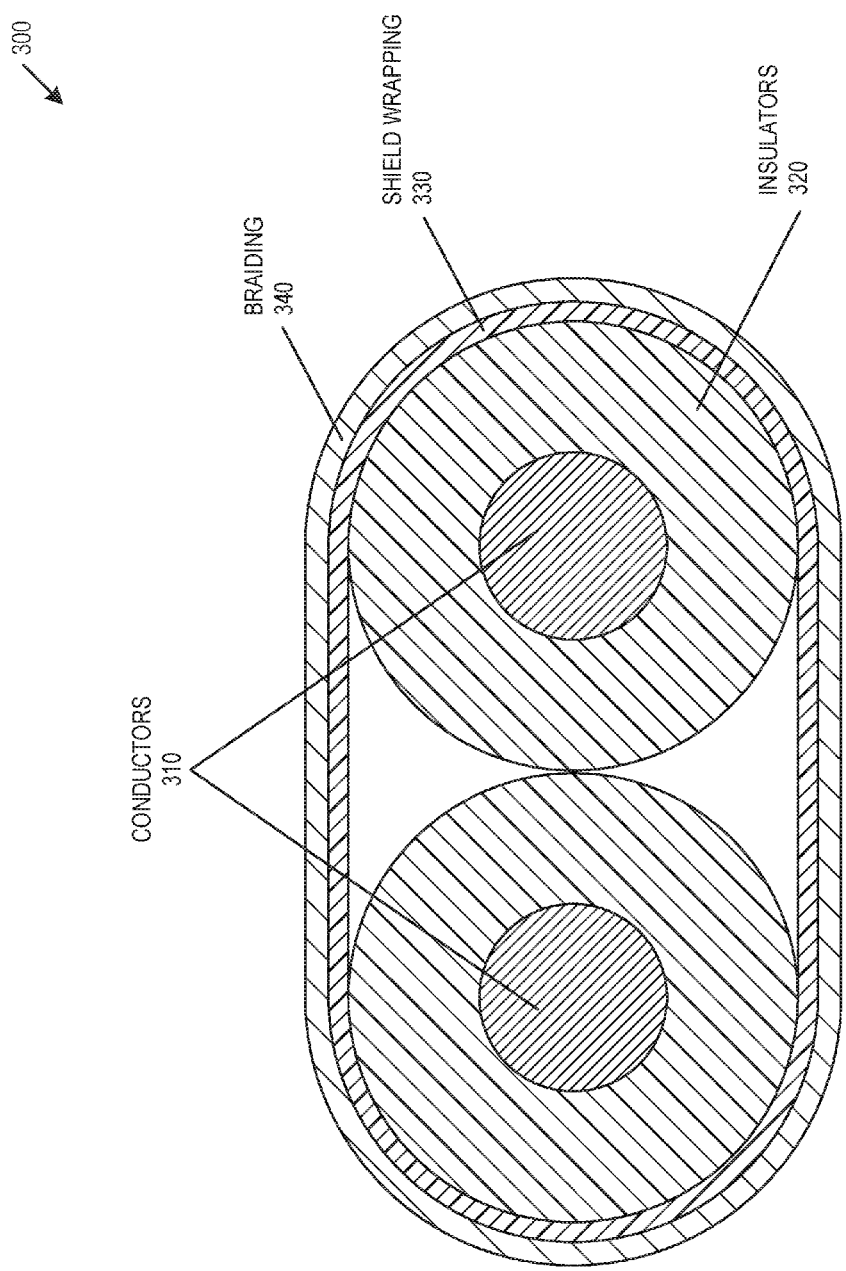
FIG. 3 is a section view of the coaxially insulated twinax cable, in accordance with at least one embodiment of the invention.

FIG. 3 is a section view of the coaxially insulated twinax cable 300, in accordance with at least one embodiment of the invention. Twinax cable 300 includes a pair of conductors 310, where each conductor is surrounded by insulators 320. A shield wrapping 330 is applied to the insulators 320. A conductive braiding 340 is applied to the shield wrapping 330.

Figure 4:
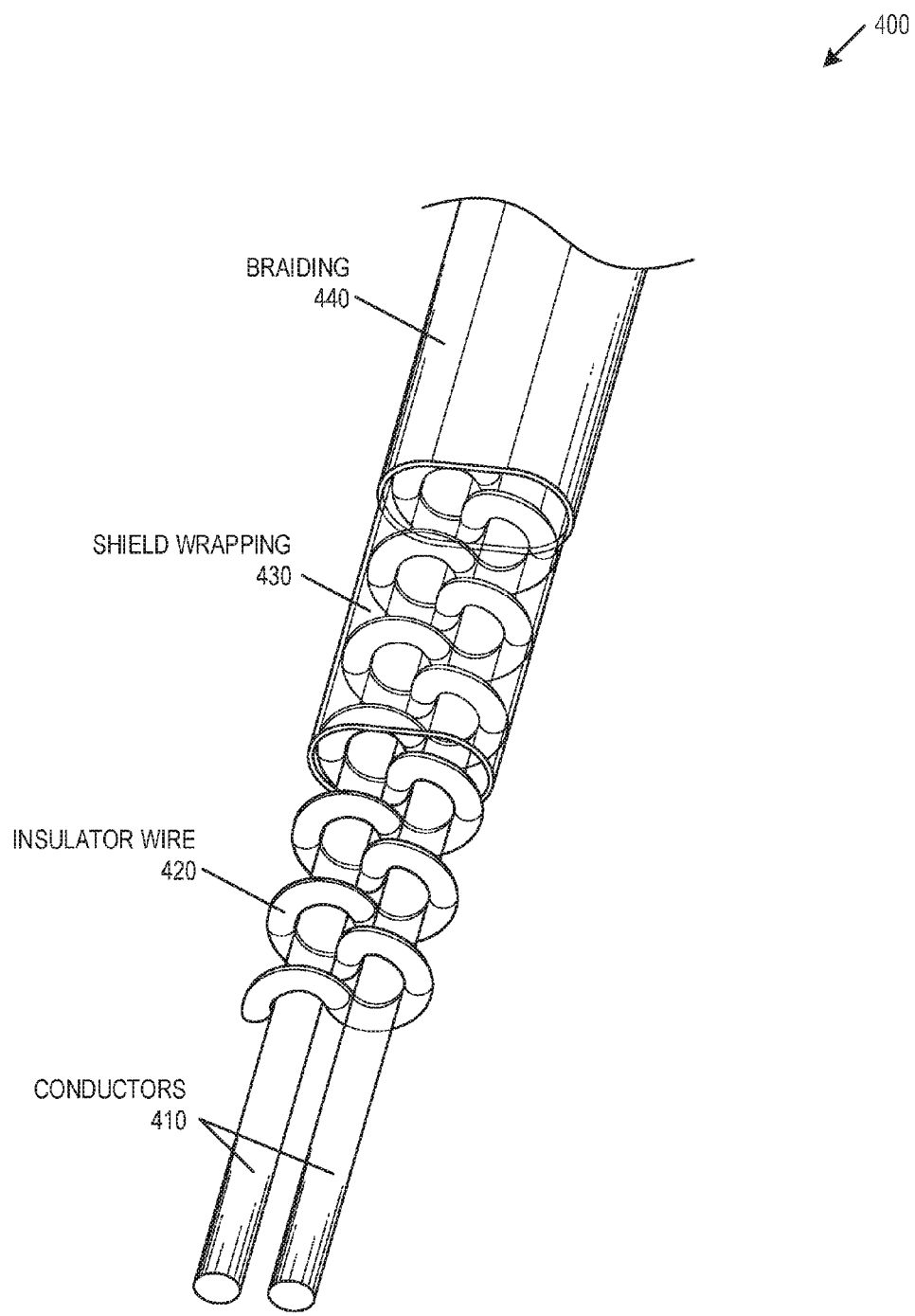
FIG. 4 is a perspective diagram of a helically insulated twinax cable, in accordance with at least one embodiment of the invention.

FIG. 4 is a perspective diagram of a helically insulated twinax cable 400, in accordance with at least one embodiment of the invention. Twinax cable 400 includes a pair of conductors 410, where each conductor is surrounded by insulator wire 420. In an example, insulator wire 420 is formed from polytetrafluoroethylene (PTFE) wire or another flexible dielectric insulator wire. The insulator wire 420 is wrapped around the pair of conductors 410 in a helical figure-eight pattern. A shield wrapping 430 is applied to the insulator wire 420. In an example, the shield wrapping 430 is formed from a composite of copper and polyethylene terephthalate, or other suitable shield wrapping material. A conductive braiding 440 is applied to the shield wrapping 430. In an example, the conductive braiding 440 is formed from braided copper or other conductive material. In an example, an insulator jacket (not shown) is applied to the conductive braiding 440 for further cable isolation and protection.

The helical configuration of the insulator wire 420 offers several advantages. In addition to the insulating properties provided by the insulator wire 420 itself, the insulator wire 420 provides air pockets within the shield wrapping 430. The dielectric insulation provided by the air pockets is greater than the dielectric insulation provided by the insulator wire 420. This overall increased air percentage in mixed air-wire media results in lower effective dielectric loss and lower effective dielectric constant. The air percentage may be increased further by reducing the insulator diameter or increasing the spacing (e.g., pitch) between successive helical windings.

The insulator wire 420 also provides structural integrity. For example, the helical configuration retains the conductors 410 in close mutual proximity. This increases the overall strength of the twinax cable 400. The increased structural integrity of the insulator wire 420 and conductors 410 also allows for design flexibility in selecting various materials for the shield wrapping 430 or braiding 440.

Figure 5:
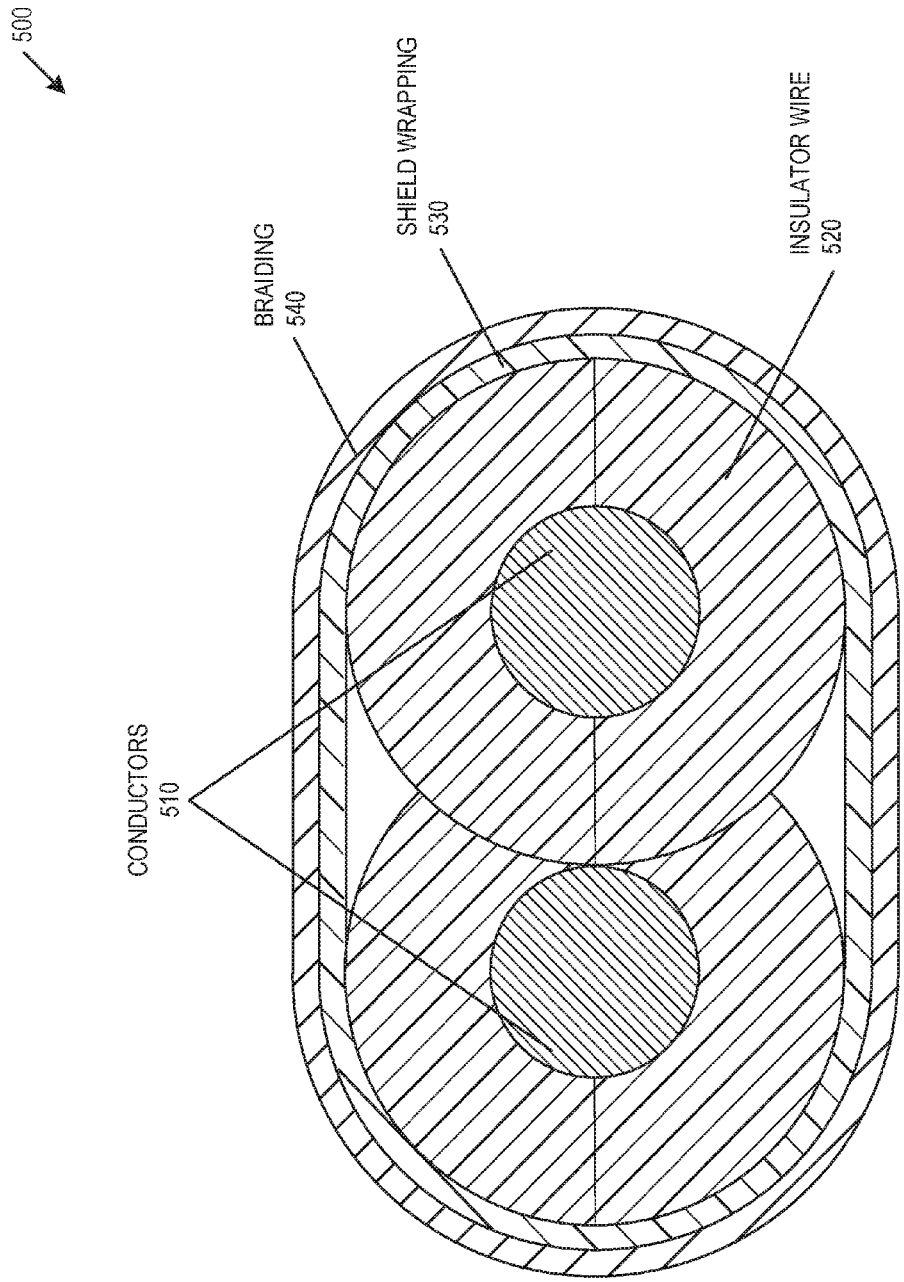
FIG. 5 is a section view of the helically insulated twinax cable, in accordance with at least one embodiment of the invention.

FIG. 5 is a section view of the helically insulated twinax cable 500, in accordance with at least one embodiment of the invention. Twinax cable 500 includes a pair of conductors 510, where each conductor is surrounded by insulator wire 520 wrapped around the pair of conductors 510 in a helical figure-eight pattern shown in FIG. 4. A shield wrapping 530 is applied to the insulator wire 520, and a conductive braiding 540 is applied to the shield wrapping 530.

The helical configuration of the insulator wire 520 offers the additional advantage of reducing the cross-sectional area of the twinax cable 500. As can be seen when comparing FIG. 4 and FIG. 5, for a given insulator diameter, the helical configuration shown in FIG. 5 allows the central portion of the insulator wire 520 to overlap, resulting in a smaller cross-sectional area. The increased air percentage of the twinax cable enables further reduction in cable size. For the a given target impedance, the helically wound insulator wire 520 allows the diameter of the insulator wire 520 to be smaller than insulators 320 shown in FIG. 3, resulting in a further reduction of the cross-sectional area of conductors 510 and insulator wire 520. The reduction in cable cross-sectional area reduces manufacturing cost and complexity, such as by using less material in the insulator wire 520, shield wrapping 530, and braiding 540. The reduction in cable cross-sectional area also enables more twinax cables 500 to be bundled together, such as in multiple-cable I/O ports.

Figure 6:
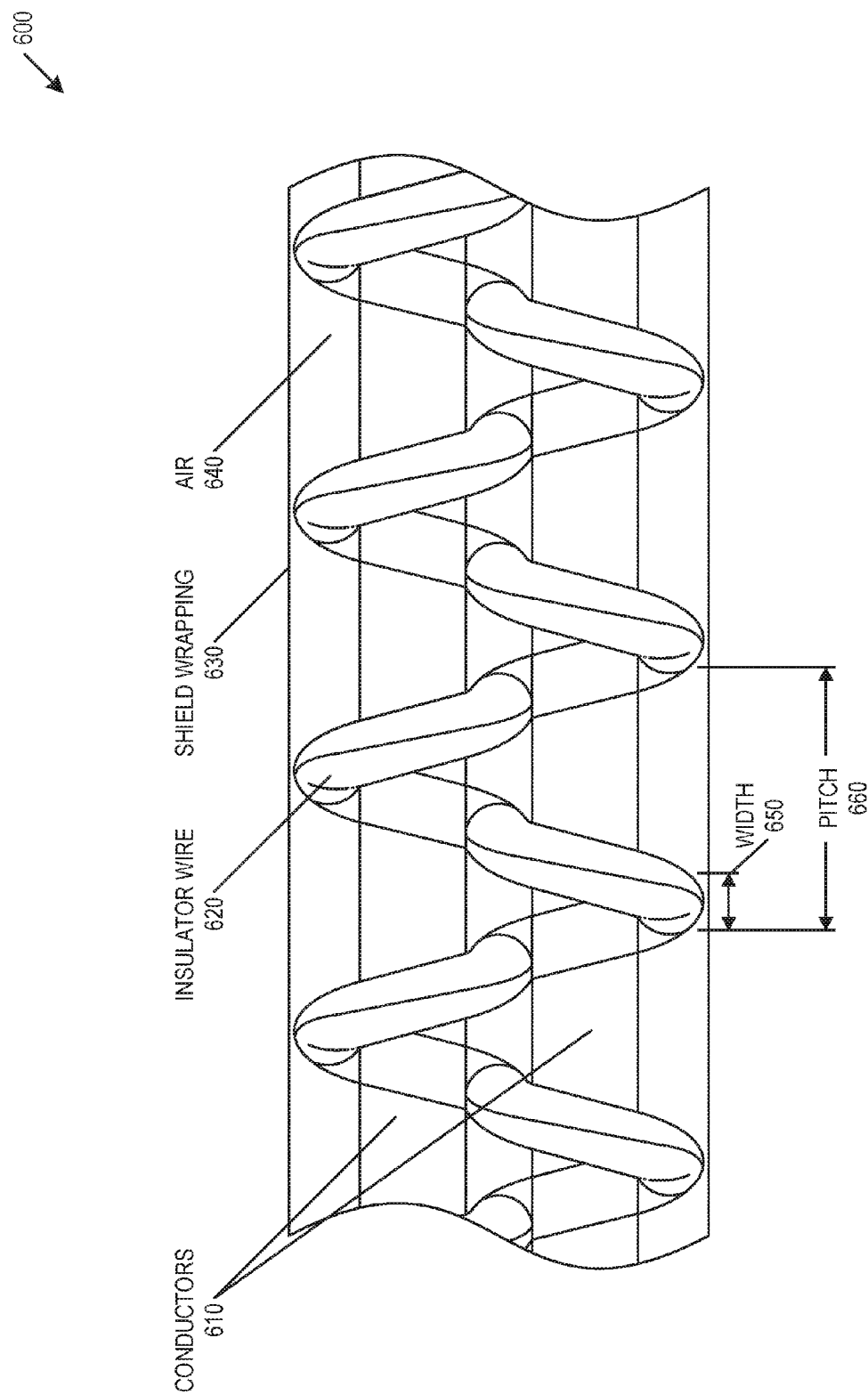
FIG. 6 is a side perspective view of a linear twinax cable, in accordance with at least one embodiment of the invention.

FIG. 6 is a side perspective view of a linear twinax cable 600, in accordance with at least one embodiment of the invention. The twinax cable 600 includes a conductors 610, an insulator wire 620 wrapped around the conductors 610, and a shield wrapping 630 around the insulator wire 620. The insulator wire 620 supports the shield wrapping 630, leaving a space for air 640. The volume of air 640 is a function of the width 650 and pitch 660 between successive helical windings of the insulator wire 620. For example, the percentage of air volume is increased by reducing the width 650, by increasing the pitch 660, or both. The width 650 and pitch 660 may be selected to provide specific structural integrity properties. For example, the width 650 and pitch 660 may be selected to retain the conductors 610 in close mutual proximity to increase the overall strength of the twinax cable 600. In another example, the width 650 and pitch 660 may be selected to maintain isolation between the conductors 610 when a cable is bent, such as shown in FIG. 7.

Figure 7:
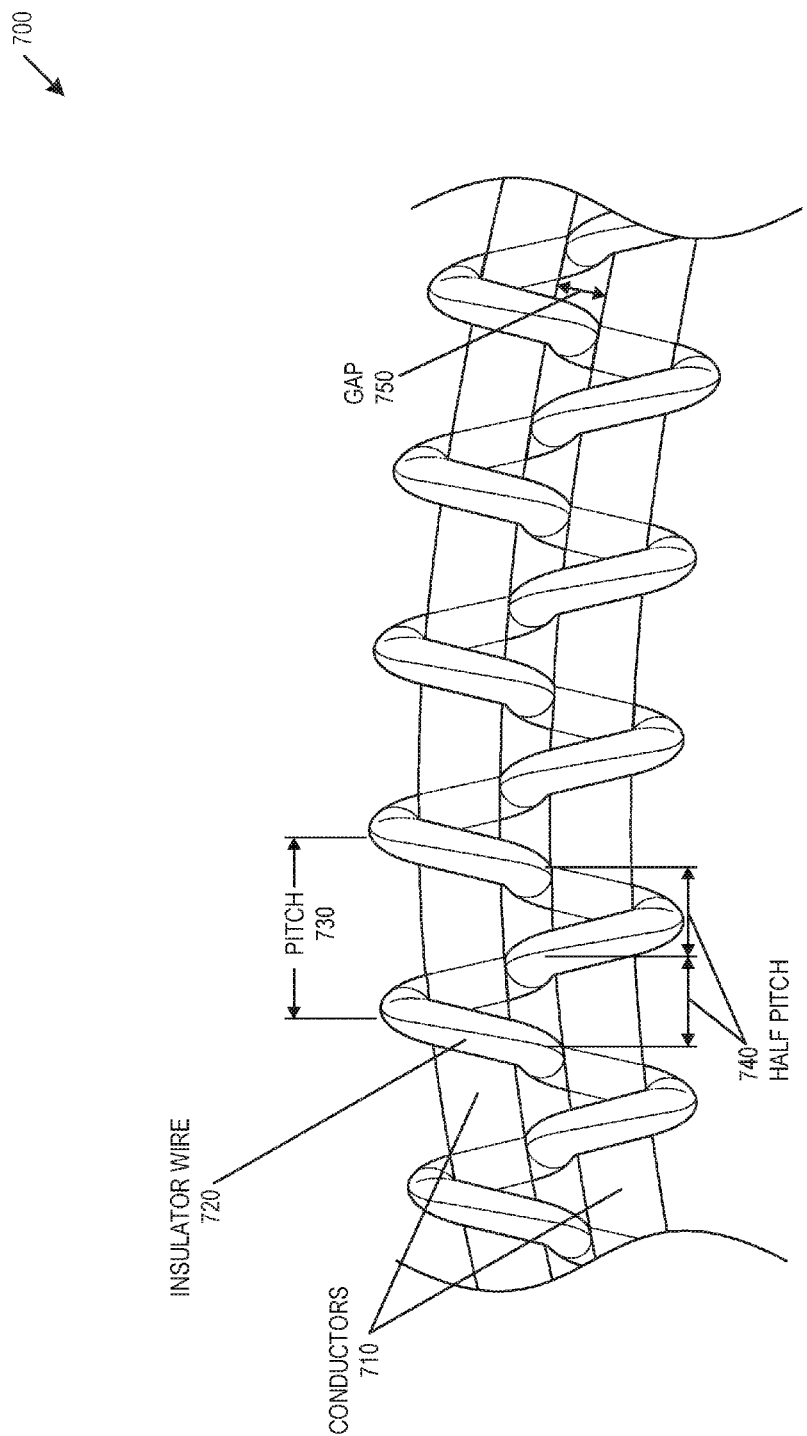
FIG. 7 is a side perspective view of a bent twinax cable, in accordance with at least one embodiment of the invention.

FIG. 7 is a side perspective view of a bent twinax cable 700, in accordance with at least one embodiment of the invention. As shown in FIG. 7, the isolation between the conductors 710 is maintained by the insulator wire 720. The isolation is important in maintaining the differential signaling of the twinax cable 700, in preventing the conductors from short-circuiting, and in reducing the differential signaling ability of the twinax cable 700. A short-circuit is mostly likely to occur when the conductors 710 are bent in the same plane as the conductors 710, such as the bend shown in FIG. 7. The pitch 730 is selected to reduce or eliminate the probability of a short circuit. For example, for a given pitch 730, the intra-conductor spacing between successive windings of the insulator wire 720 is approximately half of pitch 730, such as shown in the half-pitch 740 between conductors 710. In an example, the diameter of the insulator wire 720 is be selected in conjunction with the pitch 730 to provide a desired gap 750 between conductors 710, where the gap 750 is selected to reduce or eliminate the probability of a short circuit. The helical winding of the insulator wire 720 and friction between the insulator wire 720 and shield wrapping (not shown) also resists short-circuit, further maintaining the isolation between the conductors 710.

Figure 8A:
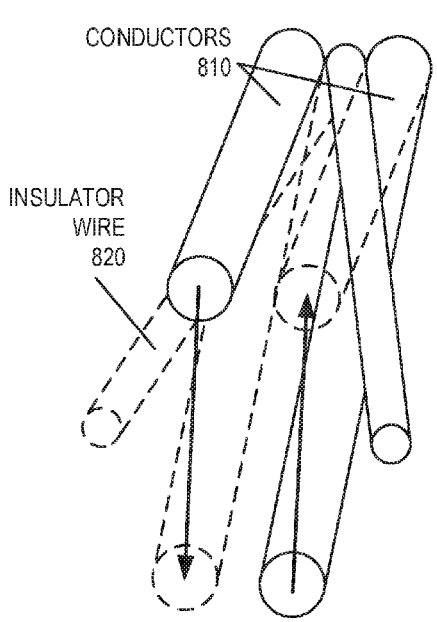
FIGS. 8A-8D are perspective views of a twinax cable helical braiding process, in accordance with at least one embodiment of the invention.
Figure 8B:
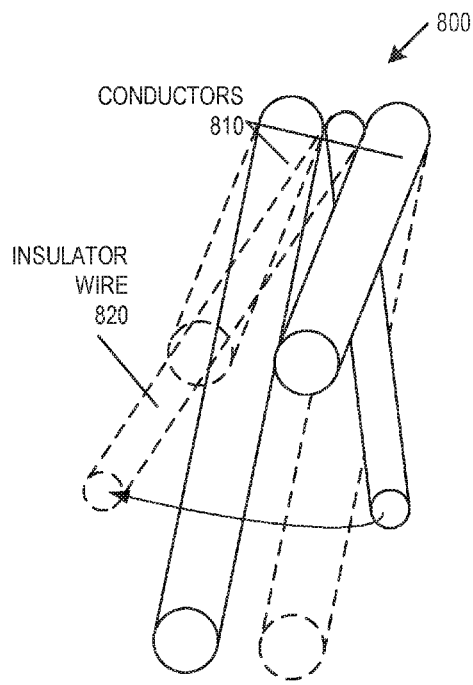
Figure 8C:
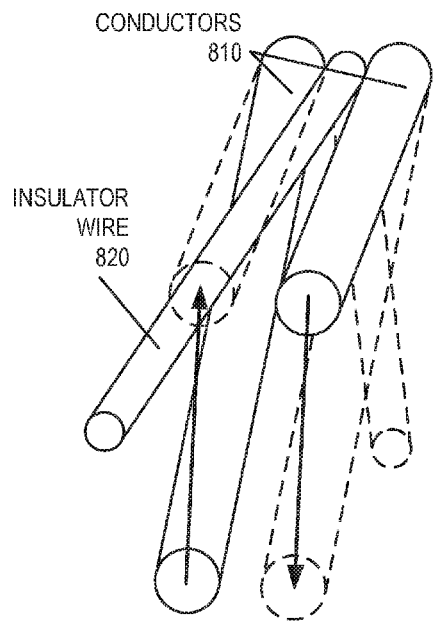
Figure 8D:
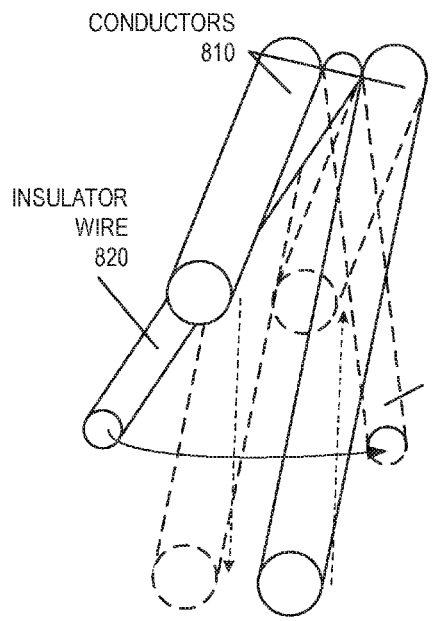

FIGS. 8A-8D are perspective views of a twinax cable helical braiding process 800, in accordance with at least one embodiment of the invention. FIG. 8A shows the conductors 810 and insulator wire 820 in a first position. As shown in FIG. 8A, the conductors 810 move in up-and-down direction but out-of-phase with respect to each other. For example, the insulator wire 820 may be held in a given position while conductors 810 are moved in the direction shown by the arrows in FIG. 8A, resulting in a new position of conductors 810 shown in FIG. 8B. Following the movement of the conductors 810, the insulator wire 820 is moved from right to left, resulting in the configuration shown in FIG. 8C. The conductors 810 are again moved, this time in the direction shown by the arrows in FIG. 8C, resulting in the configuration shown in FIG. 8D. Finally, the insulator wire 820 is moved from left to right, resulting in the configuration shown in FIG. 8A. The conductors 810 and insulator wire 820 are moved in a direction away from the viewer during the braiding process 800, resulting in the helical figure-eight winding shown in FIGS. 4, 6, and 7. In an example, the speed of movement of the cables and the speed of the braiding process 800 is selected to create a desired constant helical winding pitch. In another example, the speed of cable movement and speed of braiding process 800 is varied to create a desired varying helical winding pitch. The braiding process 800 may be combined with other cable preparation steps, including wrapping the braided helical configuration in shield wrapping, outer layer braiding, or a plastic outer coating. In an example, the braiding process 800 is extended to wrap three, four, or more conductors 810 using one or more insulator wires 820.

Figure 9:
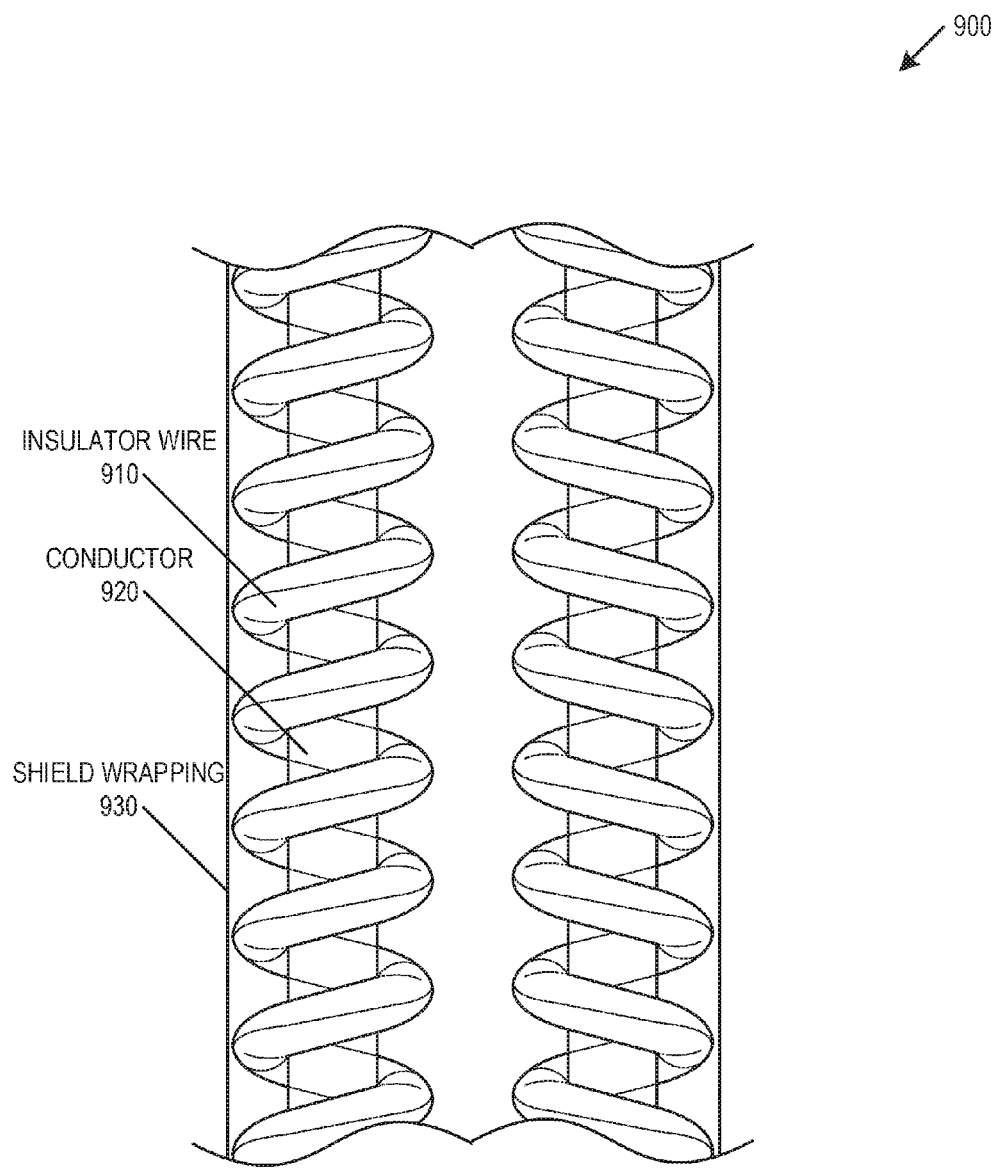
FIG. 9 is a top perspective view of a linear twinax cable, in accordance with at least one embodiment of the invention.

FIG. 9 is a top perspective view of a twinax cable 900, in accordance with at least one embodiment of the invention. As an alternative to the braiding process 800, the helical insulation configuration is realized by helically wrapping an insulator wire 910 around each conductor 920. Pairs of finished wires are then brought in proximity and wrapped in shield wrapping 930 and other layers to complete cable construction. In an example, the winding of the insulator wire 910 around one conductor 920 is orthogonal to the winding direction of a second conductor 920, such as the clockwise and counterclockwise threading directions shown in FIG. 9. The orthogonal threading direction further reduces the probability of direct contact or shorting between conductors 920. In an example, the individual winding process is extended to wrap three, four, or more conductors 920 using one or more insulator wires 910.

Figure 10:
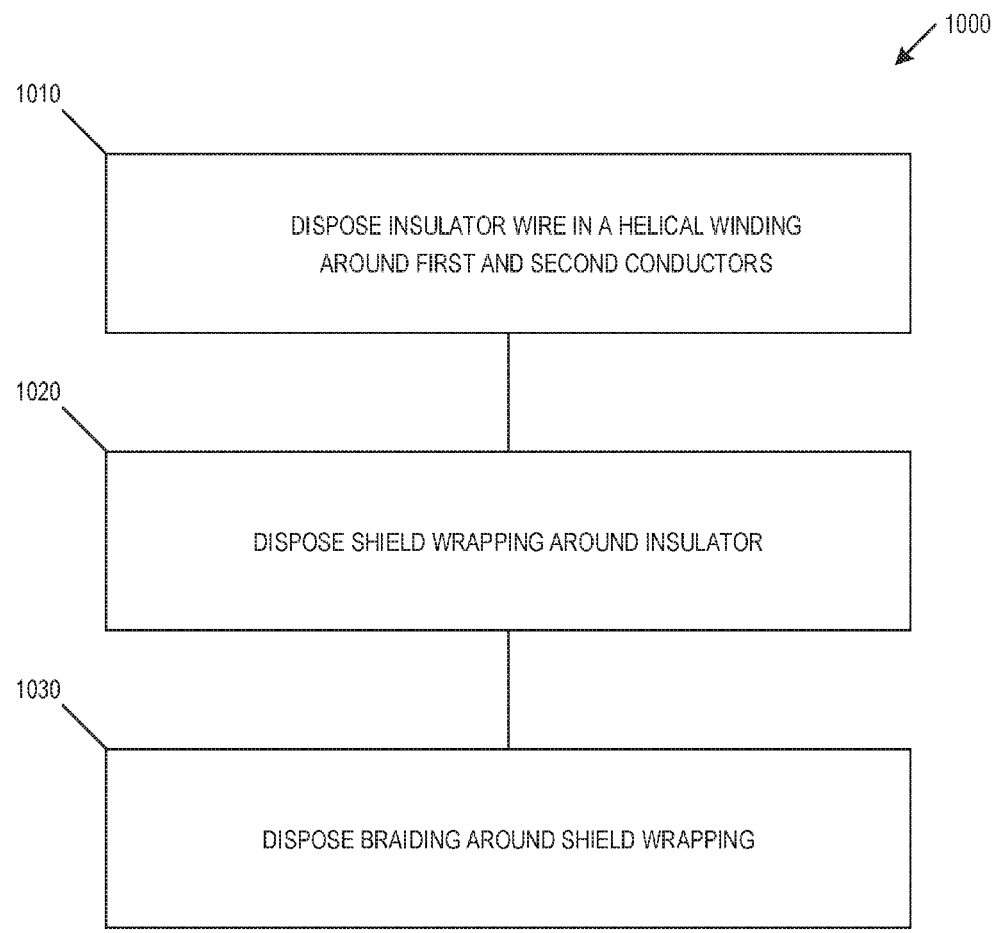
FIG. 10 is a block diagram of a helically insulated twinax cable method, in accordance with at least one embodiment of the invention.

FIG. 10 is a block diagram of a helically insulated twinax cable method 1000, in accordance with at least one embodiment of the invention. Method 1000 includes disposing 1010 an insulator wire in a helical winding around a first and second conductor. In an example, the insulator wire is wrapped around the pair of conductors in a helical figure-eight pattern, such as shown in FIG. 4. In another example, an insulator wire is wrapped around a first conductor in a clockwise helical pattern, and an insulator wire is wrapped around a second conductor in a counterclockwise helical pattern, such as shown in FIG. 9. Method 1000 includes disposing 1020 a shield wrapping around the insulator-wrapped conductors. In an example, the shield wrapping is formed from a copper polyethylene terephthalate, or other suitable shield wrapping material. Method 1000 includes disposing 1030 a conductive braiding around the shield wrapping. In an example, the conductive braiding is formed from braided copper or other conductive material.

Figure 11:
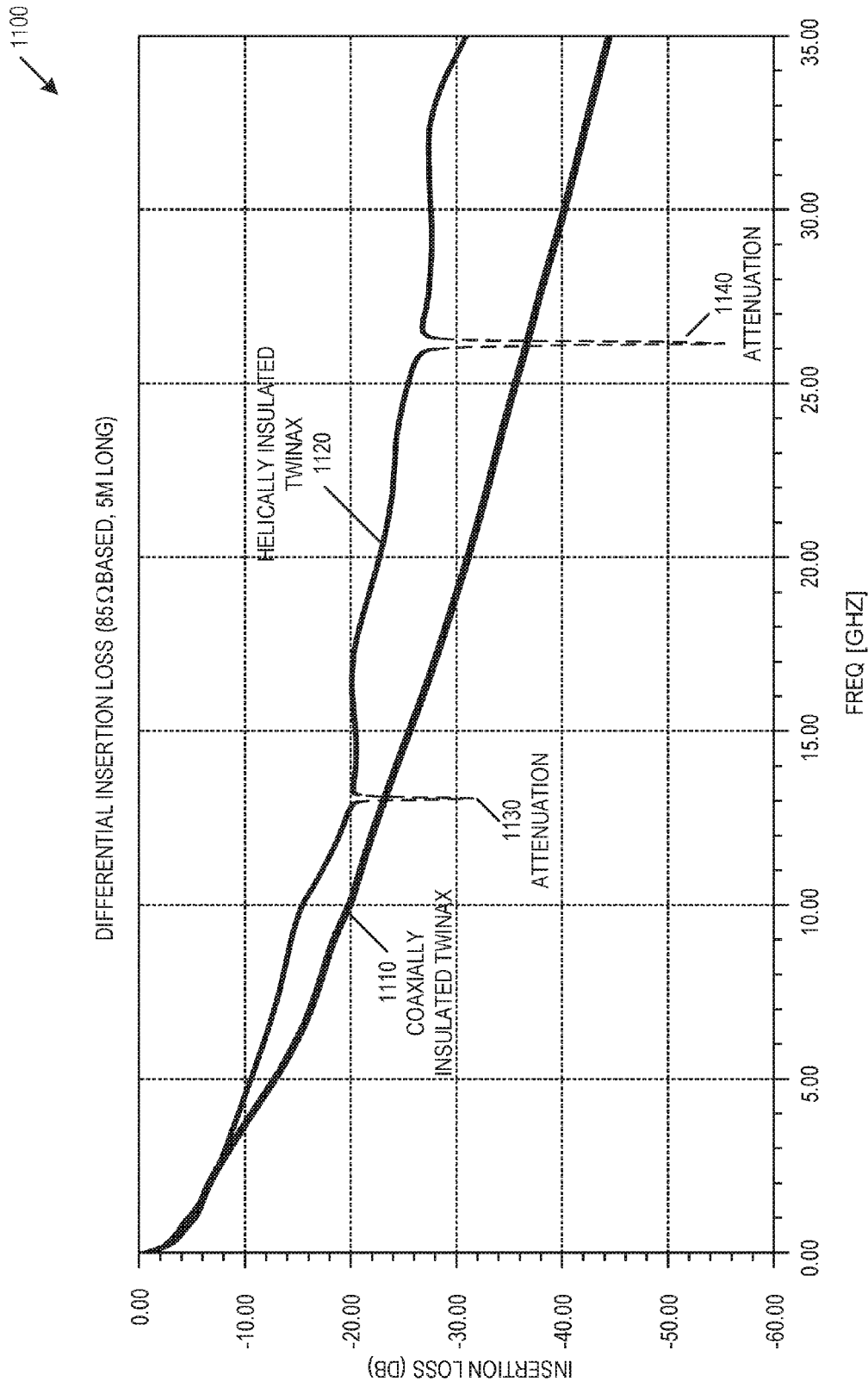
FIG. 11 is a differential insertion loss graph, in accordance with at least one embodiment of the invention.

FIG. 11 is a differential insertion loss graph 1100, in accordance with at least one embodiment of the invention. Graph 1100 compares the insertion loss corresponding to a coaxially insulated twinax cable 1110 to the insertion loss corresponding to a helically insulated twinax cable 1120. Graph 1100 was generated using a 3-D commercial electromagnetic (EM) field solver to calculate scattering parameters for performance comparison. Graph 1100 was generated using copper conductors, polytetrafluoroethylene (PTFE) insulators, a conductor gauge of 26 AWG, and a cable length of 20.25 mm. The coaxially insulated twinax cable 1110 included an insulator diameter of 0.97 mm, whereas the helically insulated twinax cable 1120 included an insulator wire diameter of 0.25 mm with a winding pitch of 1 mm. The longer cable length of 5 meters was obtained by cascading the 20.25 mm multiple times.

As shown in Graph 1100, the helically insulated twinax cable 1120 demonstrates greater insertion loss values over frequencies ranging from 0 Hz to 35 GHz. For example, 10 GHz, the helically insulated twinax cable 1120 demonstrates approximately a 5 dB gain over coaxially insulated twinax cable 1110. Graph 1100 also shows narrow-band attenuation 1130 and 1140 as a frequency-dependent dip in insertion loss. This attenuation 1130 and 1140 is sometimes referred to as "suckout," and is caused by multiple signal reflections resulting from the periodic winding structure of the helically insulated twinax cable 1120. A technique for mitigating attenuation 1130 and 1140 is shown and described with respect to FIG. 12 below.

Figure 12:
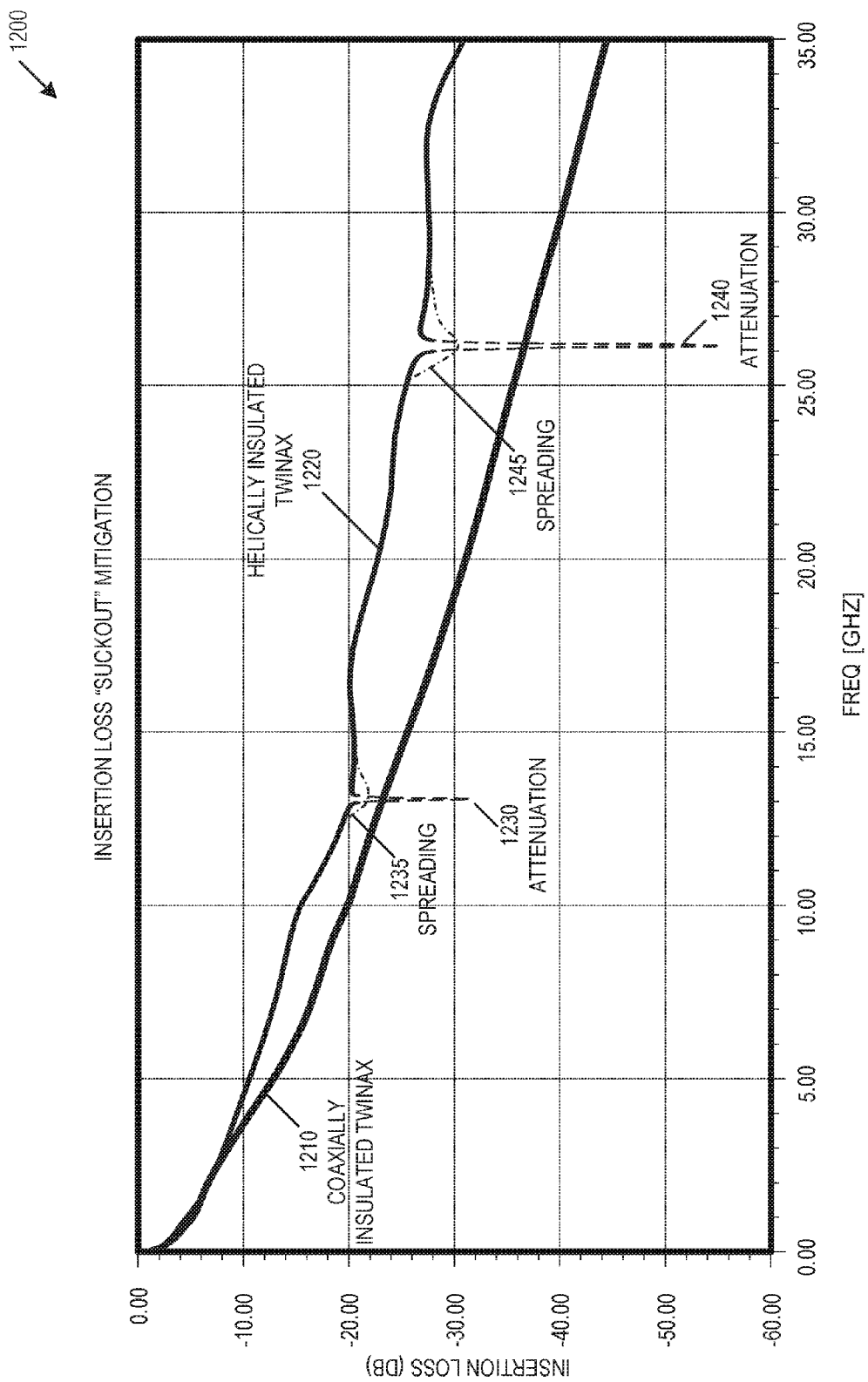
FIG. 12 is an attenuation mitigation graph, in accordance with at least one embodiment of the invention.

FIG. 12 is an attenuation mitigation graph 1200, in accordance with at least one embodiment of the invention. Graph 1200 compares the insertion loss corresponding to a coaxially insulated twinax cable 1210 to the insertion loss corresponding to a helically insulated twinax cable 1220. Graph 1200 also shows narrow-band attenuation 1230 and 1240 as a frequency-dependent dip in insertion loss. Because attenuation 1230 and 1240 caused by multiple signal reflections resulting from the periodic winding structure of the helically insulated twinax cable 1210, attenuation 1230 and 1240 is mitigated by using a random pitch winding or continuously varying pitch winding. Graph 1200 shows the effect of varying the winding pitch. Attenuation peak 1230 may be reduced to the spread peak 1235, and attenuation peak 1240 may be reduced to the spread peak 1245. The effect of varying winding pitch is to widen the attenuation dip frequency range while reducing the total attenuation. This effect is analogous to the effect of using Spread Spectrum Clocking (SSC) to lower peak energy.

In an example, the winding pitch is varied during the cable manufacturing process, such as by varying the speed of the cable progression or the insulator wire braiding process. The winding pitch variation is bounded by a maximum value and a minimum value to provide desired structural and attenuation properties. In an example, the maximum pitch is based on mechanical requirements, such as desired cable strength and conductor isolation. In an example, the minimum pitch is based on desired average dielectric constant value (e.g., desired air percentage value). In an example, the winding pitch is varied randomly between the minimum pitch and the maximum pitch. In an example, the winding pitch is varied by increasing the pitch monotonically to the maximum pitch, by decreasing the pitch monotonically to the minimum pitch, and repeating the increase and decrease throughout the cable.

Figure 13:
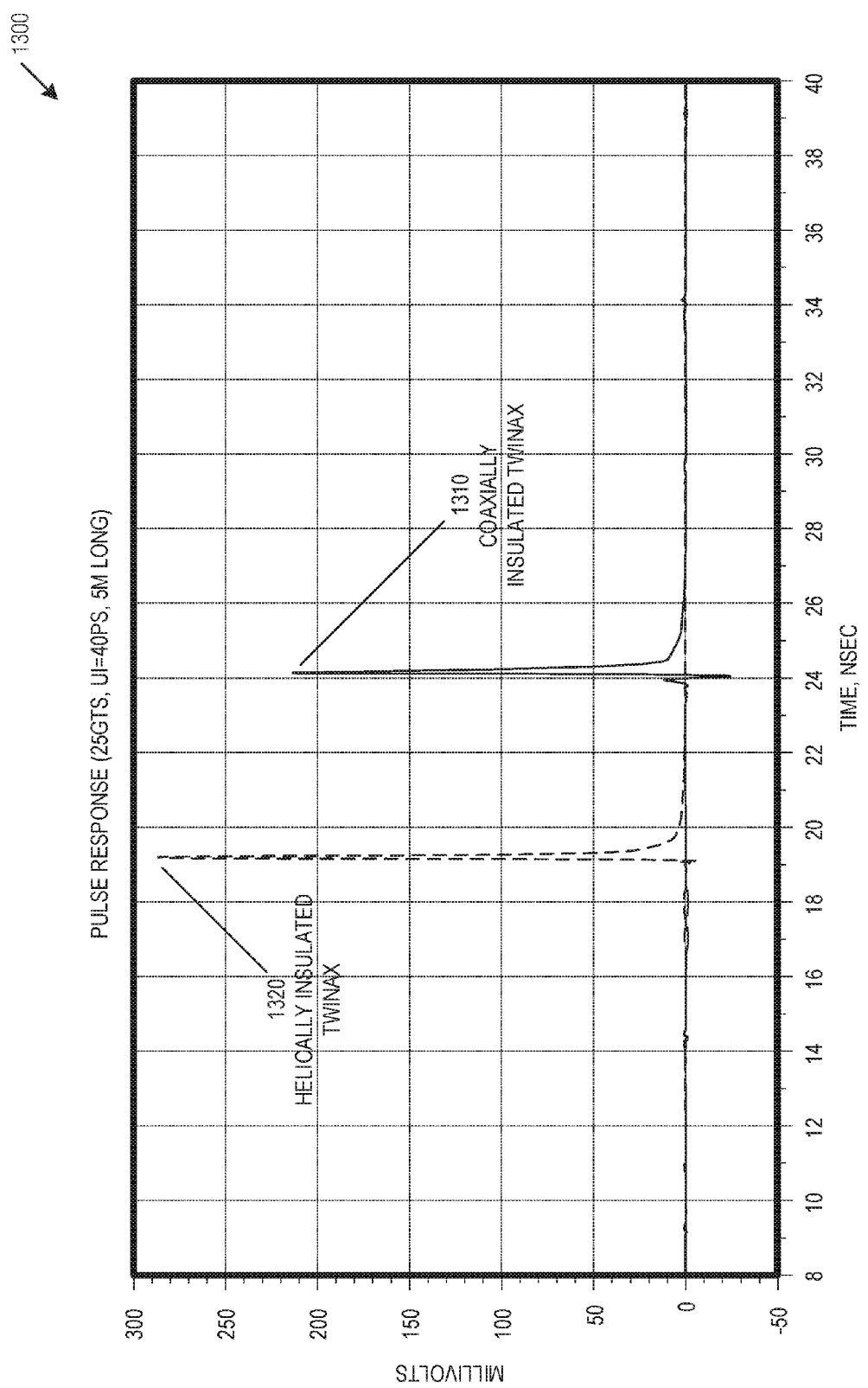
FIG. 13 is a time-domain pulse response graph, in accordance with at least one embodiment of the invention.

FIG. 13 is a time-domain pulse graph 1300, in accordance with at least one embodiment of the invention. Graph 1300 shows a pulse response of an incident signal. In an example, a calculated scattering parameter is imported into a time domain circuit solver to calculate the pulse response at 25 GTs for a 5 meter cable. Pulse 1320 is the response from a helically insulated twinax cable and pulse 1310 is the response from a coaxially insulated twinax cable. Graph 1300 was generated without mitigating the "suckout," yet the helically insulated twinax 1320 still shows higher magnitude, an improved pulse shape, and a reduced inter-symbol interference over coaxially insulated twinax 1310.

Figure 14:
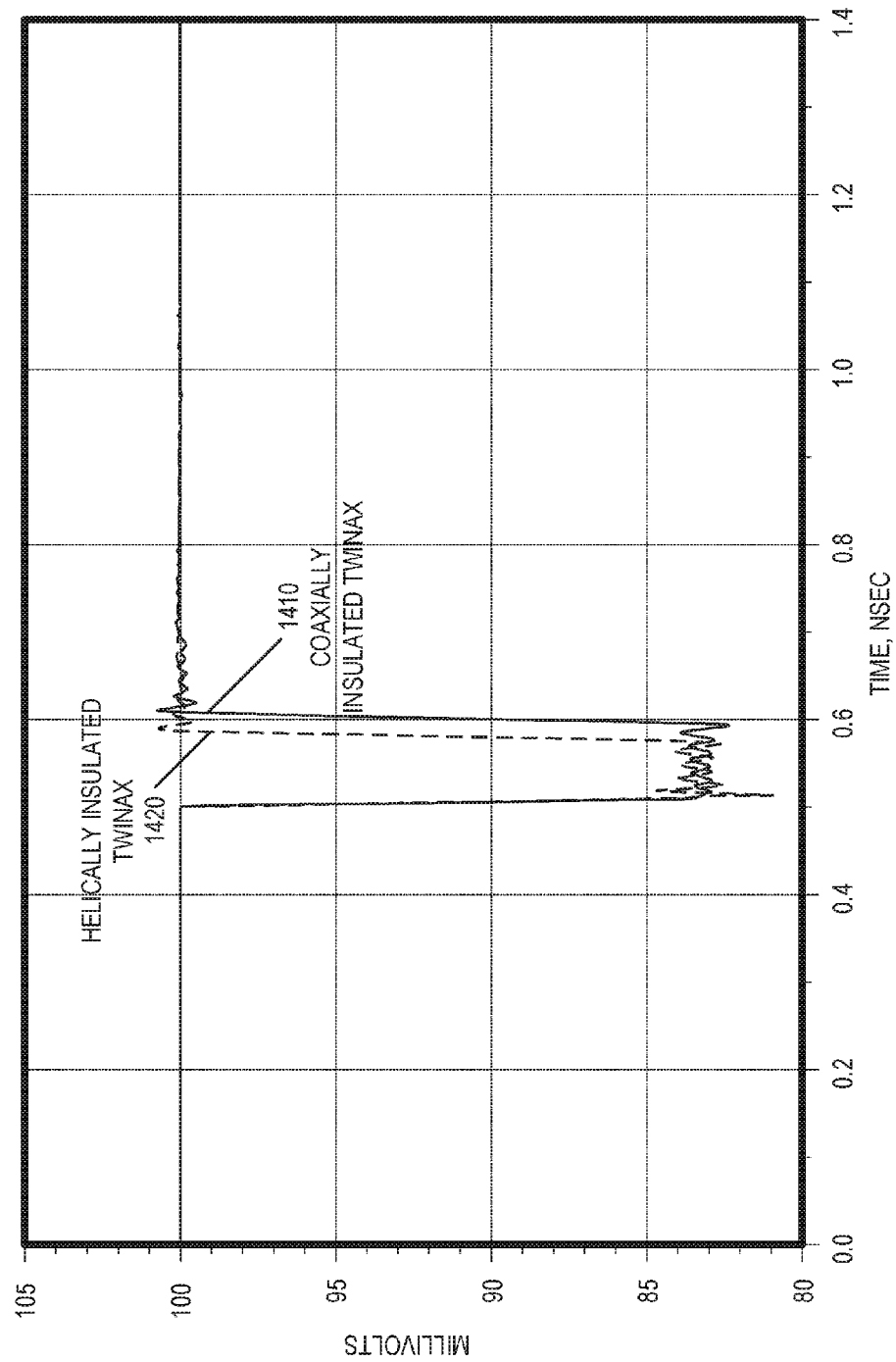
FIG. 14 is a time-domain reflectometer (TDR) graph, in accordance with at least one embodiment of the invention.

FIG. 14 is a time-domain reflectometer (TDR) graph 1400, in accordance with at least one embodiment of the invention. As shown in graph 1400, both the helically insulated twinax 1420 and the coaxially insulated twinax 1410 yield a similar impedance, though the helically insulated twinax 1420 demonstrates a shorter reflection duration than the coaxially insulated twinax 1410. For a given impedance value, the increased air content of the helically insulated twinax 1420 results in an improved transmission time over the coaxially insulated twinax 1410.

Figure 15:
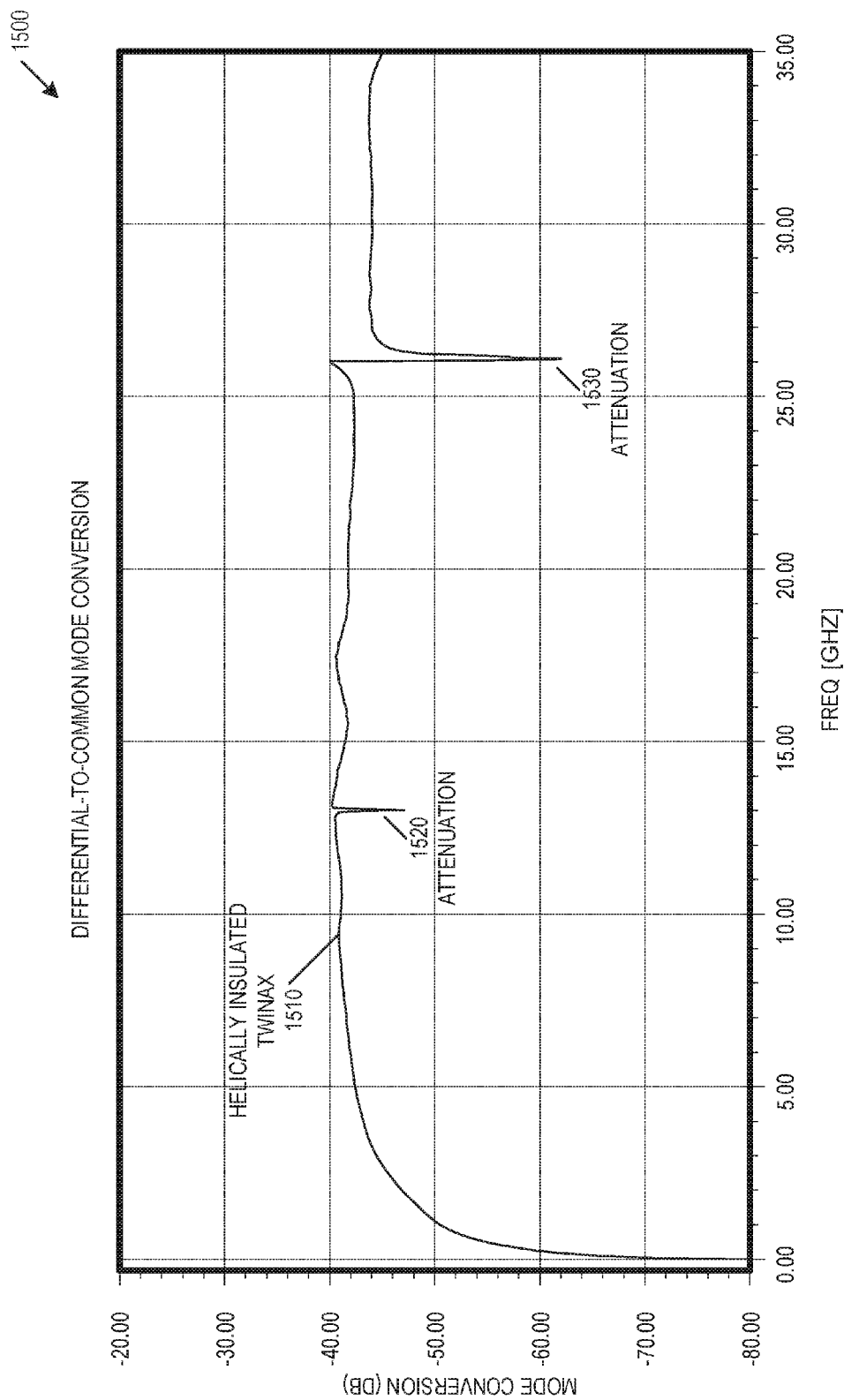
FIG. 15 is a differential-to-common mode conversion graph, in accordance with at least one embodiment of the invention.

FIG. 15 is a differential-to-common mode conversion graph 1500, in accordance with at least one embodiment of the invention. Graph 1500 shows that the mode conversion for differential mode to common mode for helically insulated twinax 1510 is less than −40 dB for frequencies between 0 Hz and 35 GHz. While the "suckout" mitigation techniques described above may reduce the magnitude of the attenuation discontinuities 1520 and 1530, the differential-to-common mode is expected to remain below −40 dB.

Figure 16:
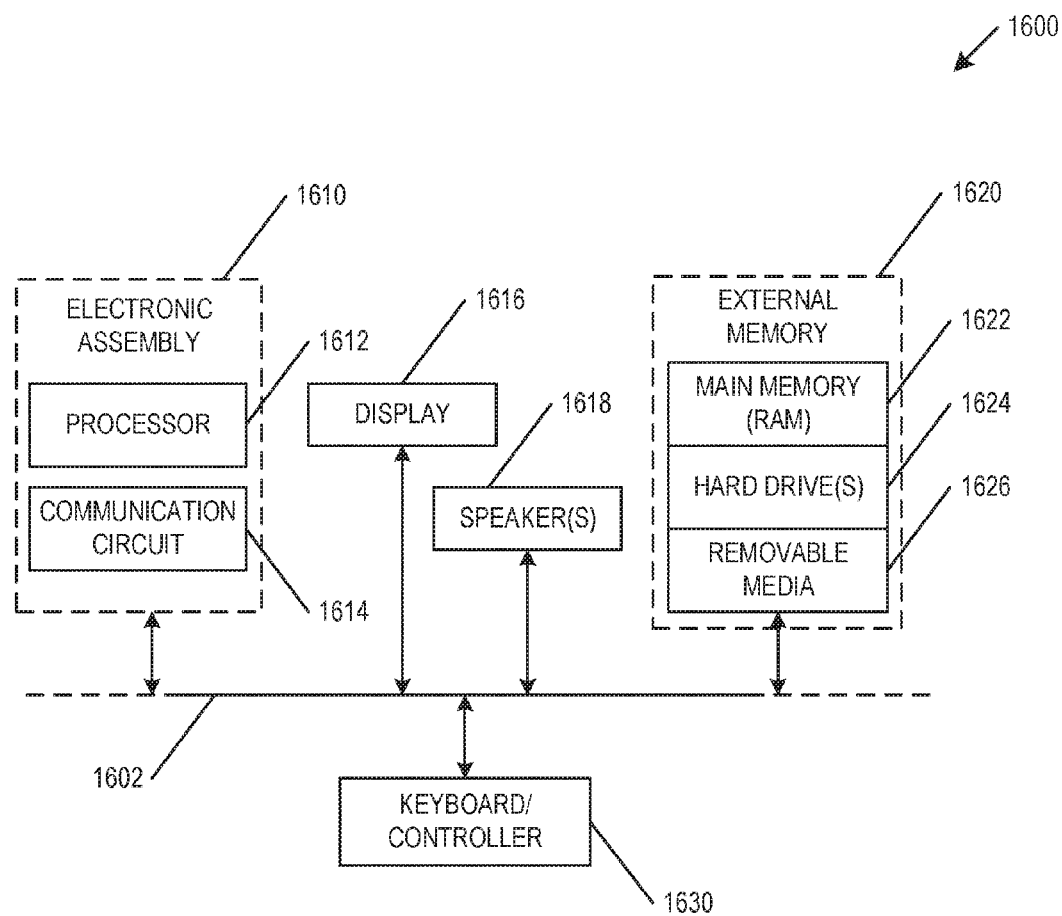
FIG. 16 is a block diagram of an electronic device incorporating the helically insulated cable apparatus or method in accordance with at least one embodiment of the invention.

FIG. 16 is a block diagram of an electronic device 1600 incorporating the helically insulated cable apparatus or method in accordance with at least one embodiment of the invention. FIG. 16 shows an example of an electronic device using semiconductor chip assemblies and solders as described in the present disclosure is included to show an example of a higher-level device application for the present invention. Electronic device 1600 is merely one example of an electronic system in which embodiments of the present invention can be used. Examples of electronic devices 1600 include, but are not limited to personal computers, tablet computers, mobile telephones, game devices, MP3 or other digital music players, etc. In this example, electronic device 1600 comprises a data processing system that includes a system bus 1602 to couple the various components of the system. In an example, system bus 1602 is implemented using the helically insulated cable to provide communications links among the various components of the electronic device 1600. System bus 1602 can be implemented as a single bus, as a combination of busses, or in any other suitable manner.

An electronic assembly 1610 is coupled to system bus 1602, such as using a helically insulated cable. The electronic assembly 1610 can include any circuit or combination of circuits. In one embodiment, the electronic assembly 1610 includes a processor 1612 that can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 1610 are a custom circuit, an application-specific integrated circuit (ASIC), or the like, such as, for example, one or more circuits (such as a communications circuit 1614) for use in wireless devices like mobile telephones, personal data assistants, portable computers, two-way radios, and similar electronic systems. The IC can perform any other type of function.

The electronic device 1600 can also include an external memory 1620, which in turn can include one or more memory elements suitable to the particular application, such as a main memory 1622 in the form of random access memory (RAM), one or more hard drives 1624, and/or one or more drives that handle removable media 1626 such as compact disks (CD), flash memory cards, digital video disk (DVD), and the like.

The electronic device 1600 can also include a display device 1616, one or more speakers 1618, and a keyboard and/or controller 1630, which can include a mouse, trackball, touch screen, voice-recognition device, or any other device that permits a system user to input information into and receive information from the electronic device 1600.

To better illustrate the method and apparatuses disclosed herein, a non-limiting list of embodiments is provided here:

Example 1 is a method comprising: disposing an insulator wire in a first helical winding around a first conductor, between the first conductor and a second conductor, and in a second helical winding around the second conductor; and disposing a shield wrapping around the insulator wire to form air pockets between insulator wire windings.

In Example 2, the subject matter of Example 1 optionally includes varying a helical winding pitch between successive helical windings.

In Example 3, the subject matter of Example 2 optionally includes progressing the first and second conductors while disposing the insulator wire, wherein varying the helical winding pitch includes varying a progression speed for the first and second conductors.

In Example 4, the subject matter of any one or more of Examples 2-3 optionally include wherein varying the helical winding pitch includes varying the helical winding pitch between a minimum pitch and a maximum pitch.

In Example 5, the subject matter of any one or more of Examples 2-4 optionally include wherein varying the helical winding pitch includes randomly varying the helical winding pitch between successive helical windings.

In Example 6, the subject matter of any one or more of Examples 4-5 optionally include wherein varying the helical winding pitch includes increasing the helical winding pitch monotonically to the maximum pitch and subsequently decreasing the helical winding pitch monotonically to the minimum pitch.

In Example 7, the subject matter of any one or more of Examples 4-6 optionally include wherein the minimum pitch is selected based on a desired air percentage value.

In Example 8, the subject matter of any one or more of Examples 4-7 optionally include wherein the maximum pitch is selected based on a desired conductor isolation.

In Example 9, the subject matter of any one or more of Examples 1-8 optionally include wherein the insulator wire includes an insulating material with an associated low dielectric constant.

In Example 10, the subject matter of Example 9 optionally includes wherein the insulator wire includes polytetrafluoroethylene (PTFE).

In Example 11, the subject matter of any one or more of Examples 1-10 optionally include wherein the shield wrapping includes a composite of copper and polyethylene terephthalate.

Example 12 is a machine-readable medium including instructions, which when executed by a computing system, cause the computing system to perform any of the methods of Examples 1-11.

Example 13 is an apparatus comprising means for performing any of the methods of Examples 1-11.

Example 14 is an apparatus comprising: a first conductor and a second conductor; an insulator wire wound in a first helical winding around the first conductor, between the first conductor and the second conductor, and in a second helical winding around the second conductor; and a shield wrapping disposed around the insulator wire to form air pockets between insulator wire windings.

In Example 15, the subject matter of Example 14 optionally includes wherein a helical winding pitch is varied between successive helical windings.

In Example 16, the subject matter of Example 15 optionally includes wherein the helical winding pitch is varied between a minimum pitch and a maximum pitch.

In Example 17, the subject matter of any one or more of Examples 15-16 optionally include wherein the helical winding pitch is varied randomly between successive helical windings.

In Example 18, the subject matter of any one or more of Examples 16-17 optionally include wherein the helical winding pitch increases monotonically to the maximum pitch and subsequently decreases monotonically to the minimum pitch.

In Example 19, the subject matter of any one or more of Examples 16-18 optionally include wherein the minimum pitch is selected based on a desired air percentage value.

In Example 20, the subject matter of any one or more of Examples 16-19 optionally include wherein the maximum pitch is selected based on a desired conductor isolation.

In Example 21, the subject matter of any one or more of Examples 14-20 optionally include wherein the insulator wire includes an insulating material with an associated low dielectric constant.

In Example 22, the subject matter of Example 21 optionally includes wherein the insulator wire includes polytetrafluoroethylene (PTFE).

In Example 23, the subject matter of any one or more of Examples 14-22 optionally include wherein the shield wrapping includes a composite of copper and polyethylene terephthalate.

Example 24 is at least one machine-readable storage medium, comprising a plurality of instructions that, responsive to being executed with processor circuitry of a computer-controlled device, cause the computer-controlled device to: dispose an insulator wire in a first helical winding around a first conductor, between the first conductor and a second conductor, and in a second helical winding around the second conductor; and dispose a shield wrapping around the insulator wire to form air pockets between insulator wire windings.

In Example 25, the subject matter of Example 24 optionally includes the instructions further causing the computer-controlled device to vary a helical winding pitch between successive helical windings.

In Example 26, the subject matter of Example 25 optionally includes the instructions further causing the computer-controlled device to progress the first and second conductors while disposing the insulator wire, wherein varying the helical winding pitch includes varying a progression speed for the first and second conductors.

In Example 27, the subject matter of any one or more of Examples 25-26 optionally include wherein varying the helical winding pitch includes varying the helical winding pitch between a minimum pitch and a maximum pitch.

In Example 28, the subject matter of any one or more of Examples 25-27 optionally include wherein varying the helical winding pitch includes randomly varying the helical winding pitch between successive helical windings.

In Example 29, the subject matter of any one or more of Examples 27-28 optionally include wherein varying the helical winding pitch includes increasing the helical winding pitch monotonically to the maximum pitch and subsequently decreasing the helical winding pitch monotonically to the minimum pitch.

In Example 30, the subject matter of any one or more of Examples 27-29 optionally include wherein the minimum pitch is selected based on a desired air percentage value.

In Example 31, the subject matter of any one or more of Examples 27-30 optionally include wherein the maximum pitch is selected based on a desired conductor isolation.

In Example 32, the subject matter of any one or more of Examples 24-31 optionally include wherein the insulator wire includes an insulating material with an associated low dielectric constant.

In Example 33, the subject matter of Example 32 optionally includes wherein the insulator wire includes polytetrafluoroethylene (PTFE).

In Example 34, the subject matter of any one or more of Examples 24-33 optionally include wherein the shield wrapping includes a composite of copper and polyethylene terephthalate.

Example 35 is an apparatus comprising: means for disposing an insulator wire in a first helical winding around a first conductor, between the first conductor and a second conductor, and in a second helical winding around the second conductor; and means for disposing a shield wrapping around the insulator wire to form air pockets between insulator wire windings.

In Example 36, the subject matter of Example 35 optionally includes means for varying a helical winding pitch between successive helical windings.

In Example 37, the subject matter of Example 36 optionally includes means for progressing the first and second conductors while disposing the insulator wire, wherein varying the helical winding pitch includes varying a progression speed for the first and second conductors.

In Example 38, the subject matter of any one or more of Examples 36-37 optionally include wherein varying the helical winding pitch includes varying the helical winding pitch between a minimum pitch and a maximum pitch.

In Example 39, the subject matter of any one or more of Examples 36-38 optionally include wherein varying the helical winding pitch includes randomly varying the helical winding pitch between successive helical windings.

In Example 40, the subject matter of any one or more of Examples 38-39 optionally include wherein varying the helical winding pitch includes increasing the helical winding pitch monotonically to the maximum pitch and subsequently decreasing the helical winding pitch monotonically to the minimum pitch.

In Example 41, the subject matter of any one or more of Examples 38-40 optionally include wherein the minimum pitch is selected based on a desired air percentage value.

In Example 42, the subject matter of any one or more of Examples 38-41 optionally include wherein the maximum pitch is selected based on a desired conductor isolation.

In Example 43, the subject matter of any one or more of Examples 35-42 optionally include wherein the insulator wire includes an insulating material with an associated low dielectric constant.

In Example 44, the subject matter of Example 43 optionally includes wherein the insulator wire includes polytetrafluoroethylene (PTFE).

In Example 45, the subject matter of any one or more of Examples 35-44 optionally include wherein the shield wrapping includes a composite of copper and polyethylene terephthalate.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An apparatus comprising:
a first conductor and a second conductor, the second conductor substantially parallel to the first conductor;
an insulator wire wound in a figure eight pattern around the first conductor and second conductor, the figure eight pattern including the insulator wire in a first helical winding around the first conductor, between the first conductor and the second conductor, and in a second helical winding around the second conductor; and
a shield wrapping disposed around the insulator wire to form air pockets between insulator wire windings.

2. The apparatus of claim 1, wherein a helical winding pitch is varied between successive helical windings.

3. The apparatus of claim 2, wherein the helical winding pitch is varied between a minimum pitch and a maximum pitch.

4. The apparatus of claim 3, wherein the helical winding pitch increases monotonically to the maximum pitch and subsequently decreases monotonically to the minimum pitch.

5. The apparatus of claim 3, wherein the minimum pitch is selected based on a desired air percentage value.

6. The apparatus of claim 3, wherein the maximum pitch is selected based on a desired conductor isolation to provide differential signaling.

7. The apparatus of claim 2, wherein the helical winding pitch is varied randomly between successive helical windings.

8. The apparatus of claim 1, wherein the insulator wire includes an insulating material with an associated low dielectric constant.

9. The apparatus of claim 8, wherein the insulator wire includes polytetrafluoroethylene (PTFE).

10. The apparatus of claim 1, wherein the shield wrapping includes a composite of copper and polyethylene terephthalate.

* * * * *